United States Patent
Yoshida et al.

(10) Patent No.: US 8,913,397 B2
(45) Date of Patent: Dec. 16, 2014

(54) POWER SOURCE CONTROL CIRCUIT MODULE

(75) Inventors: Masato Yoshida, Nagaokakyo (JP);
Tomohiro Nagai, Nagaokakyo (JP);
Hiroshi Matsubara, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 174 days.

(21) Appl. No.: 13/604,659

(22) Filed: Sep. 6, 2012

(65) Prior Publication Data

US 2013/0063913 A1  Mar. 14, 2013

(30) Foreign Application Priority Data

Sep. 9, 2011 (JP) .................... 2011-196611

(51) Int. Cl.
| | |
|---|---|
| H05K 7/00 | (2006.01) |
| H05K 1/02 | (2006.01) |
| G06F 1/26 | (2006.01) |
| H05K 1/11 | (2006.01) |
| H05K 3/28 | (2006.01) |

(52) U.S. Cl.
CPC ............ *H05K 1/0262* (2013.01); *G06F 1/26* (2013.01); *H05K 1/0227* (2013.01); *H05K 1/0243* (2013.01); *H05K 1/113* (2013.01); *H05K 3/284* (2013.01); *H05K 2201/0715* (2013.01); *H05K 2201/09618* (2013.01); *H05K 2201/09663* (2013.01); *H05K 1/0215* (2013.01)

USPC ............... 361/760; 361/816; 361/818

(58) Field of Classification Search
USPC ......................... 361/760, 816, 818
See application file for complete search history.

(56) References Cited

U.S. PATENT DOCUMENTS

| | | | |
|---|---|---|---|
| 8,183,465 B2* | 5/2012 | Suzuki et al. ............ | 174/260 |
| 8,296,938 B2* | 10/2012 | Carey et al. ............ | 29/830 |
| 2006/0255440 A1 | 11/2006 | Miyazaki et al. | |
| 2009/0201005 A1 | 8/2009 | Noma et al. | |

FOREIGN PATENT DOCUMENTS

| | | |
|---|---|---|
| JP | 2005-235808 A | 9/2005 |
| JP | 4662324 B2 | 3/2011 |
| WO | 03/103355 A1 | 12/2003 |
| WO | 2008/087781 A1 | 7/2008 |

* cited by examiner

*Primary Examiner* — Andargie M Aychillhum
(74) *Attorney, Agent, or Firm* — Keating & Bennett, LLP

(57) ABSTRACT

In a power source control circuit module, switching regulator devices and a linear regulator device are mounted on a surface of a laminated body so as to be spaced from each other. In an interface between dielectric layers of the laminated body, first to fifth internal ground electrodes separated by an electrode non-formation portion are provided. The first, second, fourth, and fifth internal ground electrode are connected to the respective switching regulator devices. The third internal ground electrode is connected to the linear regulator device. The first to fifth internal ground electrodes are connected to respective different external ground terminals.

6 Claims, 10 Drawing Sheets

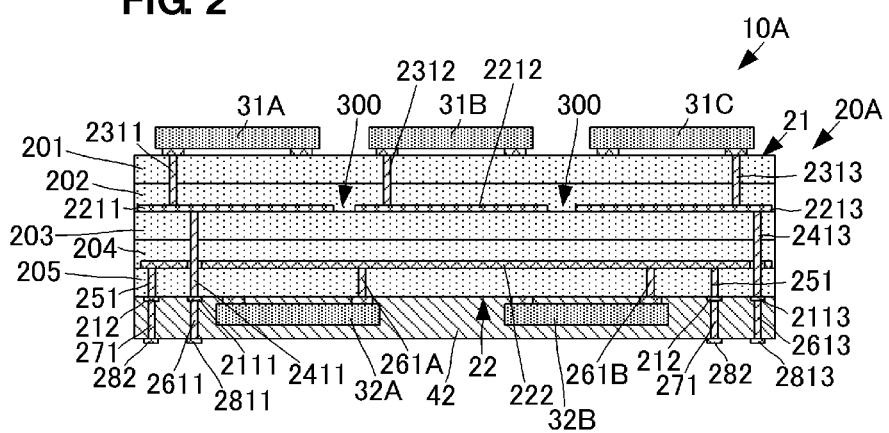

POWER SOURCE CONTROL CIRCUIT MODULE

BACKGROUND OF THE INVENTION

1. Field of the Invention

The present invention relates to a power source control circuit module including a plurality of regulators.

2. Description of the Related Art

Currently, circuit modules used for portable electronic devices are requested to densify circuit elements. Therefore, as illustrated in Japanese Unexamined Patent Application Publication No. 2005-235808, generally, such a circuit module includes a laminated body, in which a plurality of dielectric layers including electrode patterns are laminated, and a mount type electronic component mounted on the laminated body.

Incidentally, such circuit modules also include a power source control circuit module. The power source control circuit module includes various kinds of regulators, and converts electric power, supplied from an alternating-current power source or a direct-current battery, into a voltage or a current according to the power specification of an output destination (for example, a communication control module or a display control module) and outputs the voltage or current.

FIG. 10A is a side view illustrating the arrangement of individual regulator devices in a power source control circuit module of the related art, and FIG. 10B is a diagram illustrating the rough shape of the pattern of an internal ground electrode in the power source control circuit module of the related art.

A power source control circuit module 10P of the related art includes a laminated body 20P, switching regulator devices 31, and a linear regulator device 32. In the laminated body 20P, dielectric layers 201P, 202P, 203P, 204P, and 205P are sequentially laminated. An internal ground electrode 221P is formed in an interface between the dielectric layers 202P and 203P of the laminated body 20P, and an internal ground electrode 222P is formed in an interface between the dielectric layers 204P and 205P thereof. The plural switching regulator devices 31 and the linear regulator device 32 are mounted in the surface of the laminated body 20P (the surface of the dielectric layer 201P). The ground terminal of each of the plural switching regulator devices 31 is connected to the internal ground electrode 221P through a conductive via hole 231P. The internal ground electrode 221P is connected to the internal ground electrode 222P through a conductive via hole 241P. The internal ground electrode 222P is connected to an external ground connection terminal 211P formed in the back surface of the laminated body 20P, through a conductive via hole 251P.

In this way, in the power source control circuit module 10P of the related art, the plural switching regulator devices 31 and the linear regulator device 32 are connected to the same internal ground electrode 221P, and individual devices are arranged with a given distance DP therebetween so that a noise generated in the switching regulator device 31 is not propagated to the linear regulator device 32. If individual devices are arranged with a distance therebetween that is shorter than the distance DP, it is likely that, owing to interference due to a noise between the switching regulator devices 31 and interference due to a noise from the switching regulator device 31 to the linear regulator device 32, it becomes difficult for the power source control circuit module to stably control an output voltage.

Therefore, in the power source control circuit module 10P of the related art, it is necessary to maintain this distance DP. Therefore, the miniaturization of the laminated body 20P is not easy, and the miniaturization of the power source control circuit module 10P including the laminated body 20P is also not easy.

SUMMARY OF THE INVENTION

Accordingly, preferred embodiments of the present invention provide a smaller power source control circuit module without lowering the characteristic of power source control.

According to a preferred embodiment of the present invention, a power source control circuit module includes a laminated body including a plurality of dielectric layers laminated on each other, and a plurality of regulator devices mounted on a surface of the laminated body and including a switching regulator device. The power source control circuit module includes a first internal ground electrode connected to the plural regulator devices and provided on substantially the whole surface of a given dielectric layer within the laminated body, and a first external ground connection terminal connected to the first internal ground electrode and provided on a back surface of the laminated body. The first internal ground electrode of the power source control circuit module is electrically divided with respect to each of the regulator devices. Individual electrodes included in the divided first internal ground electrode are connected to the respective different first external ground connection terminals.

In this configuration, since the grounds of individual regulator devices are not connected within the laminated body, isolation between individual regulator devices may become high. Accordingly, noise interference between a plurality of switching regulator devices that is likely to mutually generate noises or noise interference from a switching regulator device to a linear regulator device is significantly reduced and prevented. In addition, since individual electrodes are spaced from each other owing to an electrode non-formation portion, even if a device distance is made smaller than the configuration of the related art, it is possible to sufficiently secure isolation between devices.

In addition, it is preferable that the power source control circuit module according to a preferred embodiment of the present invention includes the following configuration. The power source control circuit module preferably includes a circuit element mounted on the back surface of the laminated body and susceptible to an external noise, a second internal ground electrode arranged on substantially the whole surface of a dielectric layer different from the first internal ground electrode, and a second external ground connection terminal connected to the second internal ground electrode and arranged on the back surface of the laminated body. In addition, the circuit element that is susceptible to an external noise is connected to the second internal ground electrode.

In this configuration, the plural regulator devices including a switching regulator device that is likely to generate a noise are mounted on the surface of the laminated body, and the circuit element that is susceptible to an external noise is mounted on the back surface of the laminated body. Furthermore, internal ground electrodes, connected to a regulator device mounted on the surface of the laminated body and an element mounted on the back surface of the laminated body, are different from each other. Therefore, it is be possible to realize a high isolation between the regulator device mounted on the surface of the laminated body and the circuit element mounted on the back surface of the laminated body and susceptible to an external noise. Accordingly, a noise generated in the regulator device mounted on the surface of the laminated body does not propagate to the circuit element mounted on the back surface of the laminated body and susceptible to an external noise, and it is possible to protect the circuit element that is susceptible to an external noise.

In addition, in the power source control circuit module according to a preferred embodiment of the present invention, the following configuration may be applied. The regulator devices mounted on the surface of the laminated body preferably are switching regulator devices. The circuit element mounted on the back surface of the laminated body and susceptible to an external noise preferably is a linear regulator device or a digital IC device.

In this configuration, the switching regulator devices that are likely to generate a noise and the linear regulator device or digital IC device generating little noise and susceptible to an external noise are mounted on the surfaces of the laminated body, which face each other, and the ground electrodes thereof are also not connected within the laminated body. Accordingly, it is possible to further reduce and prevent the negative influence of a noise generated from the switching regulator device on the linear regulator device or digital IC device that is susceptible to an external noise.

In addition, it is desirable that the power source control circuit module according to a preferred embodiment of the present invention includes the following configuration. The power source control circuit module includes a plurality of first conductive via holes, a back surface side insulating resin, and a plurality of second conductive via holes. The first conductive via holes have shapes substantially extending in the lamination direction of the laminated body and establish connection between the first internal ground electrode and the first external ground connection terminal. The back surface side insulating resin is provided on the back surface of the laminated body and arranged so as to cover the circuit element that is susceptible to an external noise. The second conductive via holes are formed in the back surface side insulating resin so as to be serially connected to the first conductive via holes. The plural first and second conductive via holes are arranged so as to surround a mounting area of the circuit element that is susceptible to an external noise.

In this configuration, the approximately five surrounding surfaces of the circuit element that is susceptible to an external noise are surrounded owing to the first and second internal ground electrodes and the second conductive via holes. Therefore, it is possible to protect the circuit element susceptible to an external noise from a noise radiated from the switching regulator device. Furthermore, usually, in a mother substrate in which the corresponding power source control circuit module is mounted, a ground electrode is arranged on substantially the whole area of the mounting area of the power source control circuit module. Accordingly, it is possible to three-dimensionally protect the circuit element that is susceptible to an external noise from a noise.

In addition, it is desirable that, in the power source control circuit module according to a preferred embodiment of the present invention, the first and second conductive via holes are arranged with a distance therebetween that is less than about one quarter of an effective wavelength $\lambda_N$ on the back surface side insulating resin of a noise radiated from the switching regulator device.

By determining a distance between the conductive via holes in such a way as in this configuration, a noise radiated from the switching regulator device is reliably blocked, and it is possible to prevent the noise from propagating to the circuit element that is susceptible to an external noise.

In addition, it is preferable that the power source control circuit module according to a preferred embodiment of the present invention includes the following configuration. A substantially linear electrode pattern through which a signal that is susceptible to an external noise is transmitted is provided on a given layer in the laminated body included in the power source control circuit module. The substantially linear electrode pattern is surrounded by the second ground electrode, a plurality of conductive via holes connected to the corresponding second ground electrode, and a substantially planar electrode located on a side opposite to the second ground electrode with reference to the substantially linear electrode pattern connected by the corresponding conductive via holes.

In this configuration, a case is illustrated where the substantially linear electrode pattern through which a signal that is susceptible to an external noise is transmitted is disposed within the laminated body. In addition, in this configuration, the substantially linear electrode pattern through which a signal that is susceptible to an external noise is transmitted is protected from a noise, owing to the second ground electrode, the plural conductive via holes connected to the second ground electrode, and the substantially planar electrode located on a side opposite to the second ground electrode with reference to the substantially linear electrode pattern connected by the corresponding conductive via holes.

In addition, it is preferable that the power source control circuit module according to a preferred embodiment of the present invention includes the following configuration. On the surface of the laminated body of the power source control circuit module, a shielding member is provided that has a shape substantially containing the plural regulator devices and blocks an electromagnetic wave.

In this configuration, a noise radiated from the regulator device mounted on the surface of the laminated body is blocked by the sealing member. Therefore, it is possible to further reduce and prevent a negative influence on the circuit element mounted on the back surface of the laminated body and susceptible to an external noise.

According to various preferred embodiments of the present invention, a power source control circuit module that is smaller than ever before is provided without lowering the characteristic of power source control.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a side view illustrating a configuration of a power source control circuit module according to a second preferred embodiment of the present invention.

DETAILED DESCRIPTION OF THE PREFERRED EMBODIMENTS

Figure 1A:
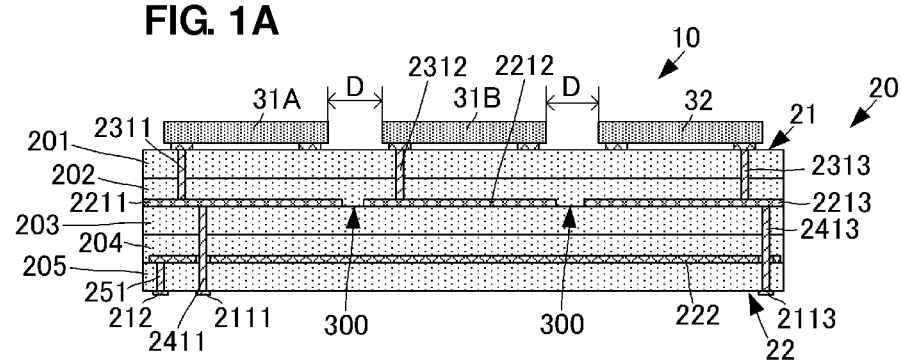
FIG. 1A is a side view illustrating a configuration of a power source control circuit module according to a first preferred embodiment of the present invention.
Figure 1B:
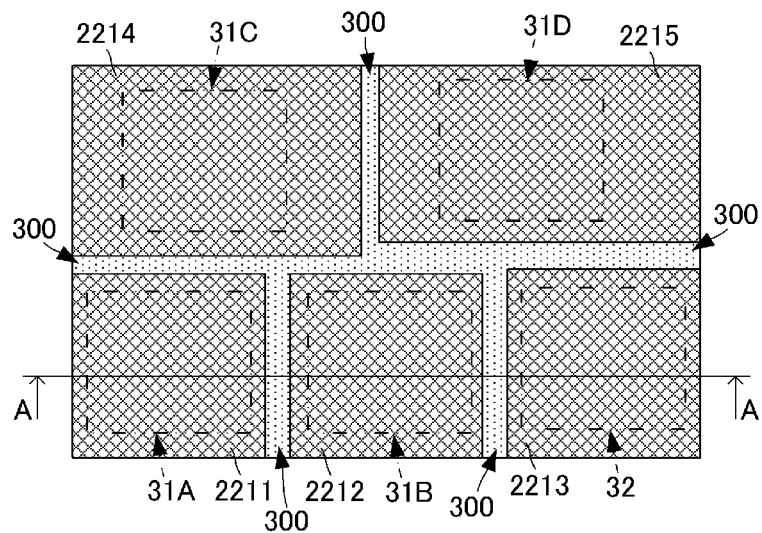
FIG. 1B is a diagram illustrating a rough shape of a pattern of an internal ground electrode.

A power source control circuit module according to a first preferred embodiment of the present invention will be described with reference to drawings. FIG. 1A is a side view illustrating the configuration of a power source control circuit module 10 according to the first preferred embodiment, and FIG. 1B is a diagram illustrating the rough shape of the pattern of an internal ground electrode. In addition, while, in the power source control circuit module 10 of the present preferred embodiment, a power input terminal, a power output terminal, and wiring pattern connected thereto preferably are also provided in addition to the illustrated electrode pattern, a wiring pattern subjected to ground connection will be only illustrated and described in the following description.

The power source control circuit module 10 preferably includes a laminated body 20, four switching regulator devices 31A, 31B, 31C, and 31D, and one linear regulator device 32.

In the laminated body 20, dielectric layers 201, 202, 203, 204, and 205 are sequentially laminated. The dielectric layer 201 and the dielectric layer 205 are configured so as to define an uppermost layer and a lowermost layer, respectively. Accordingly, the surface of the dielectric layer 201 is a surface of the laminated body 20, and the back surface of the dielectric layer 205 is a back surface 22 of the laminated body 20.

On the surface 21 of the laminated body 20 (the surface of the dielectric layer 201), mounting land electrodes and the like, not illustrated, are provided. On the surface 21 of the laminated body 20, the switching regulator devices 31A, 31B, 31C, and 31D and the linear regulator device 32 are mounted. These switching regulator devices 31A, 31B, 31C, and 31D and the linear regulator device 32 are mounted on the abovementioned mounting land electrodes. In addition, while not illustrated, various kinds of passive elements (an inductor, a capacitor, and the like) preferably are mounted on the surface 21 of the laminated body 20, configure respective DC-DC converter circuits along with the switching regulator devices 31A, 31B, 31C, and 31D, and configure a low drop out (LDO) regulator along with the linear regulator device 32.

In an interface between the dielectric layers 202 and 203 of the laminated body 20, internal ground electrodes 2211, 2212, 2213, 2214, and 2215 are provided. These internal ground electrodes 2211, 2212, 2213, 2214, and 2215 are separated from one another owing to a ground electrode non-formation portion 300 with a given width. For example, the width of the electrode non-formation portion 300 may preferably be set so as to be slightly wider than the diameter of a conductive via hole formed in the corresponding laminated body 20. In other words, on the basis of the production tolerance of the laminated body 20, the width of the electrode non-formation portion 300 may preferably be set to a width just sufficient to prevent the electrode of the conductive via hole, provided in the ground electrode non-formation portion, from being in contact with each of the internal ground electrodes 2211, 2212, 2213, 2214, and 2215.

When seen in the lamination direction of the dielectric layer, the internal ground electrode 2211 preferably has a shape substantially containing the mounting area of the switching regulator device 31A. The internal ground electrode 2211 and the switching regulator device 31A are connected to each other owing to a conductive via hole 2311 penetrating the dielectric layers 201 and 202 in the lamination direction. The internal ground electrode 2211 is connected to an external ground connection terminal 2111 provided on the back surface 22 of the laminated body 20, owing to a conductive via hole 2411 penetrating the dielectric layers 203, 204, and 205 in the lamination direction.

When seen in the lamination direction of the dielectric layer, the internal ground electrode 2212 preferably has a shape substantially containing the mounting area of the switching regulator device 31B. The internal ground electrode 2212 and the switching regulator device 31B are connected to each other owing to a conductive via hole 2312 penetrating the dielectric layers 201 and 202 in the lamination direction. The internal ground electrode 2212 is connected to an external ground connection terminal (not illustrated) provided on the back surface 22 of the laminated body 20, owing to a conductive via hole (not illustrated) penetrating the dielectric layers 203, 204, and 205 in the lamination direction.

When seen in the lamination direction of the dielectric layer, the internal ground electrode 2213 preferably has a shape substantially containing the mounting area of the linear regulator device 32. The internal ground electrode 2213 and the linear regulator device 32 are connected to each other owing to a conductive via hole 2313 penetrating the dielectric layers 201 and 202 in the lamination direction. The internal ground electrode 2213 is connected to an external ground connection terminal 2113 provided on the back surface 22 of the laminated body 20, owing to a conductive via hole 2413 penetrating the dielectric layers 203, 204, and 205 in the lamination direction.

When seen in the lamination direction of the dielectric layer, the internal ground electrode 2214 preferably has a shape substantially containing the mounting area of the switching regulator device 31C. The internal ground electrode 2214 and the switching regulator device 31C are connected to each other owing to a conductive via hole (not illustrated) penetrating the dielectric layers 201 and 202 in the lamination direction. The internal ground electrode 2214 is connected to an external ground connection terminal (not illustrated) provided on the back surface 22 of the laminated body 20, owing to a conductive via hole (not illustrated) penetrating the dielectric layers 203, 204, and 205 in the lamination direction.

When seen in the lamination direction of the dielectric layer, the internal ground electrode 2215 preferably has a shape substantially containing the mounting area of the switching regulator device 31D. The internal ground electrode 2215 and the switching regulator device 31D are connected to each other owing to a conductive via hole (not illustrated) penetrating the dielectric layers 201 and 202 in the lamination direction. The internal ground electrode 2215 is connected to an external ground connection terminal (not illustrated) provided on the back surface 22 of the laminated body 20, owing to a conductive via hole (not illustrated) penetrating the dielectric layers 203, 204, and 205 in the lamination direction.

In an interface between the dielectric layers 204 and 205 of the laminated body 20, an internal ground electrode 222 is provided. The internal ground electrode 222 is arranged along substantially the whole area of the interface between the dielectric layers 204 and 205. In the internal ground electrode 222, a ground electrode non-formation region is locally provided, and conductive via holes conductively connected to the internal ground electrodes 2211, 2212, 2213, 2214, and 2215 penetrate the corresponding ground electrode non-formation region. The internal ground electrode 222 is connected to an external ground connection terminal 212 provided on the back surface of the laminated body 20, owing to a conductive via hole 251 penetrating the dielectric layer 205 in the lamination direction. In addition, the internal ground electrode 222 functions as the ground of a circuit other than the above-mentioned DC-DC converter circuit and the LDO regulator, and may be omitted if necessary or desired.

By adopting such a configuration as described above, the internal ground electrodes 2211, 2212, 2214, and 2215 used for the switching regulator devices 31A, 31B, 31C, and 31D and the internal ground electrode 2213 used for the linear regulator device 32 are electrically separated from one another, and grounds used for respective regulator devices are not connected within the laminated body 20. Accordingly, through the ground electrodes, it is possible to significantly reduce and prevent the propagation of noises between the switching regulator devices 31A, 31B, 31C, and 31D and between the switching regulator devices 31A, 31B, 31C, and 31D and the linear regulator 32.

Therefore, even if the switching regulator devices 31A, 31B, 31C, and 31D and the linear regulator device 32 are arranged closer to one another than a configuration of the related art (D<DP), it is possible to significantly reduce and prevent the mutual propagation of noises between the switching regulator devices 31A, 31B, 31C, and 31D and the propagation of noises from the switching regulator devices 31A, 31B, 31C, and 31D to the linear regulator device 32. Accordingly, it is possible to reduce the arrangement distance of a regulator device without lowering a power source control characteristic, and it is possible to realize a power source control circuit module that is smaller than the configuration of the related art.

Next, a power source control circuit module according to a second preferred embodiment of the present invention will be described with reference to a drawing. FIG. 2 is a side view illustrating the configuration of a power source control circuit module 10A according to the second preferred embodiment. The power source control circuit module 10A of the present preferred embodiment is different from the power source control circuit module 10 illustrated in the first preferred embodiment in the arrangement of switching regulator devices and the arrangement of linear regulator devices, and the same configuration point as the first preferred embodiment will be briefly described.

Schematically, in the power source control circuit module 10A of the present preferred embodiment, switching regulator devices 31A, 31B, and 31C are mounted on the surface 21 of a laminated body 20A. In addition, linear regulator devices 32A and 32B are mounted on the back surface 22 of the laminated body 20A.

The power source control circuit module 10A preferably includes the laminated body 20A, the three switching regulator devices 31A, 31B, and 31C, and two linear regulator devices 32A and 32B, for example.

In the laminated body 20A, dielectric layers 201, 202, 203, 204, and 205 are sequentially laminated. The dielectric layer 201 and the dielectric layer 205 are configured to define an uppermost layer and a lowermost layer, respectively. Accordingly, the surface of the dielectric layer 201 is a surface of the laminated body 20A, and the back surface of the dielectric layer 205 is a back surface 22 of the laminated body 20A.

On the surface 21 of the laminated body 20A, the switching regulator devices 31A, 31B, and 31C are mounted.

In an interface between the dielectric layers 202 and 203 of the laminated body 20A, internal ground electrodes 2211, 2212, and 2213 are provided. These internal ground electrodes 2211, 2212, and 2213 are separated from one another owing to a ground electrode non-formation portion 300 having a given width.

When seen in the lamination direction of the dielectric layer, the internal ground electrode 2211 preferably has a shape substantially containing the mounting area of the switching regulator device 31A. The internal ground electrode 2211 and the switching regulator device 31A are connected to each other owing to a conductive via hole 2311 penetrating the dielectric layers 201 and 202 in the lamination direction. The internal ground electrode 2211 is connected to the external ground connection terminal 2111 provided on the back surface 22 of the laminated body 20A, owing to a conductive via hole 2411 penetrating the dielectric layers 203, 204, and 205 in the lamination direction.

When seen in the lamination direction of the dielectric layer, the internal ground electrode 2212 preferably has a shape substantially containing the mounting area of the switching regulator device 31B. The internal ground electrode 2212 and the switching regulator device 31B are connected to each other owing to a conductive via hole 2312 penetrating the dielectric layers 201 and 202 in the lamination direction. The internal ground electrode 2212 is connected to an external ground connection terminal (not illustrated) provided on the back surface 22 of the laminated body 20A, owing to a conductive via hole (not illustrated) penetrating the dielectric layers 203, 204, and 205 in the lamination direction.

When seen in the lamination direction of the dielectric layer, the internal ground electrode 2213 preferably has a shape substantially containing the mounting area of the switching regulator device 31C. The internal ground electrode 2213 and the switching regulator device 31C are connected to each other owing to a conductive via hole 2313 penetrating the dielectric layers 201 and 202 in the lamination direction. The internal ground electrode 2213 is connected to the external ground connection terminal 2113 provided on the back surface 22 of the laminated body 20A, owing to a conductive via hole 2413 penetrating the dielectric layers 203, 204, and 205 in the lamination direction.

On the back surface 22 of the laminated body 20A, the linear regulator devices 32A and 32B are mounted.

In an interface between the dielectric layers 204 and 205 of the laminated body 20A, an internal ground electrode 222 is provided. The internal ground electrode 222 is arranged along substantially the whole area of the interface between the dielectric layers 204 and 205.

The internal ground electrode 222 is connected to the linear regulator device 32A, owing to a conductive via hole 261A penetrating the dielectric layer 205 in the lamination direction. The internal ground electrode 222 is connected to the linear regulator device 32B, owing to a conductive via hole 261B penetrating the dielectric layer 205 in the lamination direction.

In the internal ground electrode 222, a ground electrode non-formation region is locally provided, and conductive via holes conductively connected to the internal ground electrodes 2211, 2212, and 2213 penetrate the corresponding ground electrode non-formation region. In addition, although not illustrated in the drawing, a conductive via hole connected to the internal ground electrode 2212 and the ground electrode non-formation region are preferably provided.

The internal ground electrode 222 is connected to an external ground connection terminal 212 provided on the back surface of the laminated body 20A, owing to a conductive via hole 251 penetrating the dielectric layer 205 in the lamination direction.

In substantially the whole area of the back surface 22 of the laminated body 20A, an insulating resin 42 is provided with a thickness allowing the linear regulator devices 32A and 32B to be buried therein. On a surface in the insulating resin 42, located on a side opposite to the laminated body 20A (hereinafter, referred to as the back surface of the insulating resin 42), external connection terminals are provided and connected to individual terminals including individual external ground connection terminals provided on the above-mentioned back surface of the laminated body 20A.

For example, an external connection terminal 2811 provided on the back surface of the insulating resin 42 is connected to the external ground connection terminal 2111 owing to a conductive member 2611 arranged so as to penetrate the insulating resin 42 in the thickness direction thereof. An external connection terminal 2813 provided on the back surface of the insulating resin 42 is connected to an external ground connection terminal 2113 owing to a conductive member 2613 arranged so as to penetrate the insulating resin 42 in the thickness direction thereof. An external connection terminal 282 provided on the back surface of the insulating resin 42 is connected to the external ground connection terminal 212 owing to a conductive member 271 arranged so as to penetrate the insulating resin 42 in the thickness direction thereof. In addition, for example, a conductive via hole or a metal pin may be used as the conductive member.

By adopting such a configuration as described above, the switching regulator devices 31A, 31B, and 31C and the linear regulator devices 32A and 32B are mounted on different surfaces in the laminated body 20A. In particular, in the configuration of the present preferred embodiment, the switching regulator devices 31A, 31B, and 31C and the linear regulator devices 32A and 32B are mounted on both respective surfaces (the surface 21 and the back surface 22) of the laminated body 20A. Accordingly, the switching regulator devices 31A, 31B, and 31C and the linear regulator devices 32A and 32B are not adjacent to each other. In addition, the internal ground electrodes 2211, 2212, and 2213 used for the switching regulator devices 31A, 31B, and 31C and the internal ground electrode 222 used for the linear regulator devices 32A and 32B are electrically separated from one another, and grounds used for respective regulator devices are not connected within the laminated body 20A.

Therefore, it is possible to enhance isolation between the switching regulator devices 31A, 31B, and 31C and the linear regulator devices 32A and 32B, and it is possible to prevent a power source control characteristic from being lowered owing to the interference of a noise. Furthermore, by mounting regulator devices on two surfaces of the laminated body 20A, it is possible to reduce an area compared with a case where the same number of regulator devices is mounted only on one surface of the laminated body. In other words, by utilizing a laminated body with a same area, it is possible to realize a power source control circuit module including more regulators.

Figure 3:
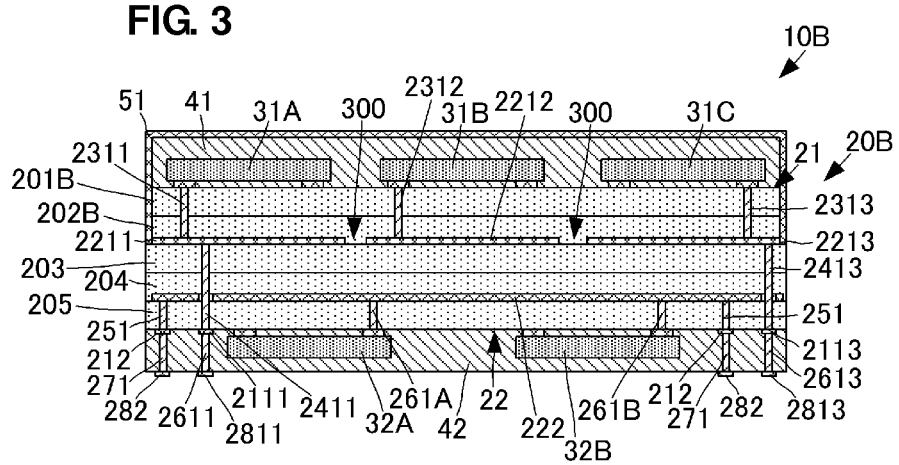
FIG. 3 is a side view illustrating a configuration of a power source control circuit module according to a third preferred embodiment of the present invention.

Next, a power source control circuit module according to a third preferred embodiment of the present invention will be described with reference to a drawing. FIG. 3 is a side view illustrating the configuration of a power source control circuit module 10B according to the third preferred embodiment. The power source control circuit module 10B of the present preferred embodiment further includes an insulating resin 41 and a shielding member 51 on the front surface side of a laminated body 20B, compared with the power source control circuit module 10A according to the second preferred embodiment, and the rest of the configuration is preferably the same as the power source control circuit module 10A according to the second preferred embodiment. Therefore, only differences will be described hereinafter.

In substantially the whole area of the surface 21 of the laminated body 20B, an insulating resin 41 is provided with a thickness allowing switching regulator devices 31A, 31B, and 31C to be buried therein. Furthermore, a substantially roof-shaped shielding member 51 is arranged so as to cover the insulating resin 41. The shielding member 51 includes conductive material such as metal.

In addition, at this time, the outer circumferences of dielectric layers 201B and 202B located on the surface 21 side of the laminated body 20B may be shaved so as to reduce the height of the power source control circuit module. In addition, the shielding member 51 is arranged so as to also cover the dielectric layers 201B and 202B.

The shielding member 51 is connected to internal ground electrodes 2211 and 2213 and the like. Accordingly, the shielding member 51 is connected to a ground.

By adopting such a configuration as described above, in addition to the advantageous effect illustrated in the second preferred embodiment, noises, radiated owing to the operations of the switching regulator devices 31A, 31B, and 31C, are blocked by the shielding member 51, and hence, noises are not radiated to the outside. In addition, since heat generated in the switching regulator devices 31A, 31B, and 31C is effectively radiated to the outside through the insulating resin 42 and the shielding member 51, it is possible to realize a power source control circuit module with a high heat dissipation property. In particular, by utilizing an insulating resin with a high thermal conductivity, it is possible to realize a power source control circuit module with a higher heat dissipation property.

In addition, a noise radiated from the switching regulator device to the outside is sufficiently smaller than a noise leaking to an internal ground electrode connected to the switching regulator device. Therefore, a noise propagating to the shielding member 51 is very small. Furthermore, the shielding member 51 is connected to an external ground connection terminal of the laminated body. Accordingly, even if a noise radiated by each of a plurality of switching regulator devices is propagated to the shielding member 51, the plural switching regulator devices do not influence one another.

As described above, by utilizing the configuration of the present preferred embodiment, it is possible to realize a power source control circuit module with higher reliability.

Figure 4:
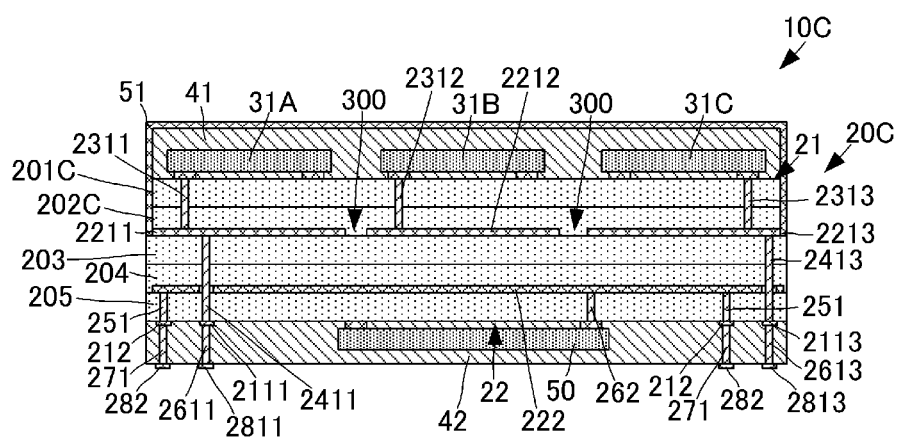
FIG. 4 is a side view illustrating a configuration of a power source control circuit module according to a fourth preferred embodiment of the present invention.

Next, a power source control circuit module according to a fourth preferred embodiment of the present invention will be described with reference to a drawing. FIG. 4 is a side view illustrating the configuration of a power source control circuit module 10C according to the fourth preferred embodiment. In the power source control circuit module 10C of the present preferred embodiment, a digital IC 50 is mounted on the back surface 22 of the laminated body 20C, in place of the linear regulator devices 32A and 32B in the module 10B according to the third preferred embodiment. Accordingly, hereinafter, only differences from the power source control circuit module 10B of the third preferred embodiment will be described.

The digital IC 50 is mounted on the back surface 22 of the laminated body 20C. The digital IC is an IC such as, for example, a serial interface control IC, a USB control IC, a logic IC, a microprocessor, an audio IC, or a video IC, which performs control or the like using a digital signal.

The internal ground electrode 222 is connected to the digital IC 50, owing to a conductive via hole 262 penetrating the dielectric layer 205 in the lamination direction.

The internal ground electrode 222 is connected to a plurality of external ground connection terminals 212 provided on the back surface of the laminated body 20A, owing to a plurality of conductive via holes 251 penetrating the dielectric layer 205 in the lamination direction.

In substantially the whole area of the back surface 22 of the laminated body 20C, an insulating resin 42 is provided with a thickness allowing the digital IC to be buried therein.

On a surface in the insulating resin 42, located on a side opposite to the laminated body 20A (hereinafter, referred to as the back surface of the insulating resin 42), external connection terminals are provided and are connected to individual terminals including individual external ground connection terminals provided on the above-mentioned back surface of the laminated body 20C.

For example, an external connection terminal 2811 provided on the back surface of the insulating resin 42 is connected to an external ground connection terminal 2111 owing to a conductive via hole 2611 formed so as to penetrate the insulating resin 42 in the thickness direction thereof. An external connection terminal 2813 provided on the back surface of the insulating resin 42 is connected to an external ground connection terminal 2113 owing to a conductive via hole 2613 formed so as to penetrate the insulating resin 42 in the thickness direction thereof. A plurality of external connection terminals 282 provided on the back surface of the insulating resin 42 are connected to the corresponding respective external ground connection terminals 212, owing to a plurality of conductive members 271 formed so as to penetrate the insulating resin 42 in the thickness direction thereof.

By adopting such a configuration as described above, the switching regulator devices 31A, 31B, and 31C and the digital IC 50 that is susceptible to a noise are mounted on different surfaces of the laminated body 20C. In particular, in the configuration of the present preferred embodiment, the switching regulator devices 31A, 31B, and 31C and the digital IC 50 are mounted on both respective surfaces (the surface 21 and the back surface 22) of the laminated body 20C. Therefore, the switching regulator devices 31A, 31B, and 31C and the digital IC 50 are not adjacent to each other. In addition, noises generated in the switching regulator devices 31A, 31B, and 31C are blocked by the shielding member 51, and hence, are not radiated to the outside. Accordingly, noises generated in the switching regulator devices 31A, 31B, and 31C are not propagated to the digital IC 50. Therefore, the digital IC 50 stably operates.

In addition, while, in the present preferred embodiment, an example has been illustrated where switching regulator devices preferably are only arranged on the surface 21 of the laminated body 20C, the switching regulator device and the linear regulator device may also be mounted on the surface 21 of the laminated body 20C in such a way as illustrated in the first preferred embodiment.

Figure 5:
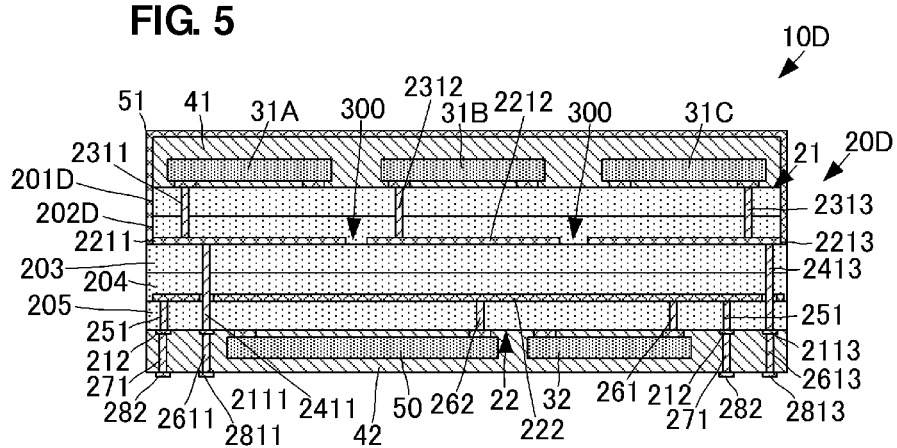
FIG. 5 is a side view illustrating a configuration of a power source control circuit module according to a fifth preferred embodiment of the present invention.

Next, a power source control circuit module according to a fifth preferred embodiment of the present invention will be described with reference to a drawing. FIG. 5 is a side view illustrating the configuration of a power source control circuit module 10D according to the fifth preferred embodiment.

While the digital IC 50 is only mounted on the module 10C according to the fourth preferred embodiment, the linear regulator device 32 and the digital IC 50 are mounted on the back surface 22 of the laminated body 20D, in the power source control circuit module 10D of the present preferred embodiment. Accordingly, hereinafter, only differences from the power source control circuit module 10C of the fourth preferred embodiment will be described.

The linear regulator device 32 and the digital IC 50 are mounted on the back surface 22 of the laminated body 20D.

The internal ground electrode 222 is connected to the linear regulator device 32, owing to a conductive via hole 261 penetrating the dielectric layer 205 in the lamination direction. The internal ground electrode 222 is connected to the digital IC 50, owing to the conductive via hole 262 penetrating the dielectric layer 205 in the lamination direction.

By adopting such a configuration as described above, the switching regulator devices 31A, 31B, and 31C, and the linear regulator device 32 and the digital IC 50, which are susceptible to a noise, are mounted on different surfaces of the laminated body 20D. In particular, in the configuration of the present preferred embodiment, the switching regulator devices 31A, 31B, and 31C, and the linear regulator device 32 and the digital IC 50 are mounted on both respective surfaces (the surface 21 and the back surface 22) of the laminated body 20D. Therefore, the switching regulator devices 31A, 31B, and 31C, and the linear regulator device 32 and the digital IC 50 are not adjacent to each other. In addition, noises generated in the switching regulator devices 31A, 31B, and 31C are blocked by the shielding member 51, and hence, are not radiated to the outside. Accordingly, noises generated in the switching regulator devices 31A, 31B, and 31C are not propagated to the linear regulator device 32 and the digital IC 50. Therefore, the linear regulator device 32 and the digital IC 50 stably operate.

In addition, while, in the configuration of the present preferred embodiment, the linear regulator device 32 and the digital IC 50 are preferably connected to the same internal ground electrode 222, since the linear regulator device 32 substantially generates little noise, the linear regulator device does not negatively influence the digital IC 50. In this regard, however, the linear regulator device 32 and the digital IC 50 may also be connected to different internal ground electrodes 222.

Figure 6A:
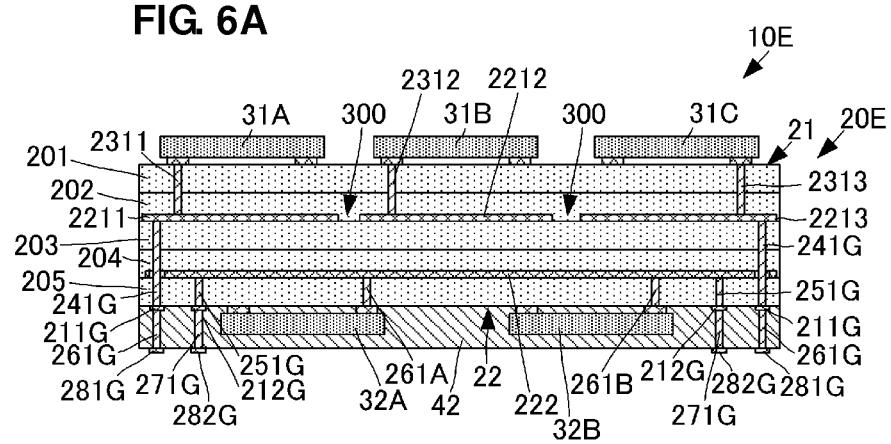
FIG. 6A is a side view illustrating a configuration of a power source control circuit module according to a sixth preferred embodiment of the present invention.

Next, a power source control circuit module according to a sixth preferred embodiment of the present invention will be described with reference to drawings. FIG. 6A is a side view illustrating the configuration of a power source control circuit module 10E according to the sixth preferred embodiment, and FIG. 6B is a diagram illustrating the arrangement pattern of conductive via holes as viewed from the back surface 22 of a laminated body 20E.

The power source control circuit module 10E of the present preferred embodiment is different, in the formation pattern of conductive via holes, from the power source control circuit module 10A according to the second preferred embodiment, and the rest of the configuration thereof is preferably the same as the power source control circuit module 10A. Accordingly, only a point that relates to the formation pattern of conductive via holes will be described.

Figure 6B:
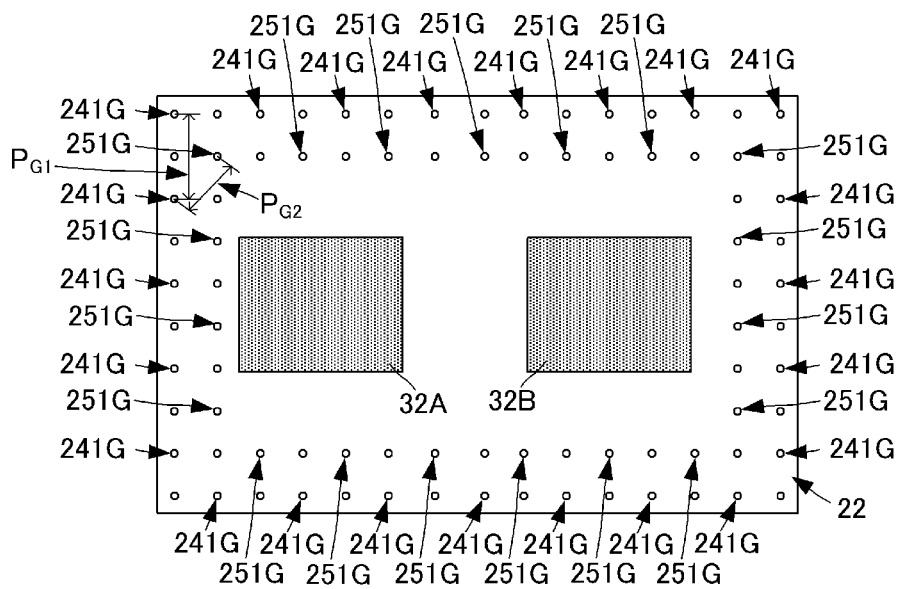
FIG. 6B is a diagram illustrating an arrangement pattern of conductive via holes.

In the dielectric layer 205 defining the lowermost layer of the laminated body 20E, as illustrated in FIG. 6B, a plurality of conductive via holes are arranged in an array along an outer circumference with a given distance therebetween. These conductive via holes are connected to various kinds of external connection terminals including external ground connection terminals. The conductive via holes are arranged in an array along the outer circumference so as to form a double line.

In the insulating resin 42, conductive via holes penetrating the insulating resin 42 in the thickness direction thereof are formed with a distance therebetween so as to be serially connected to the conductive via holes formed in the laminated body 20E, the distance being the same as the distance between the conductive via holes formed in the laminated body 20E.

A conductive via hole group on an outer circumference side (a side close to the side surface of the laminated body 20E) includes a plurality of conductive via holes 241G connected to the internal ground electrodes 2211, 2212, and 2213. A conductive via hole group on an inner circumference side (a side away from the side surface of the laminated body 20E) includes a plurality of conductive via holes 251G connected to the internal ground electrode 222. In such a configuration, the conductive via holes 241G, which are located along the side surface of the laminated body 20E and lie next to each other, are formed with a distance $P_{G1}$ therebetween. The conductive via holes 241G lying next to each other are formed with a distance $P_{G2}$ therebetween, in the corner portion of the laminated body 20E.

When, after additionally taking the permittivity of the insulating resin 42 into consideration, it is assumed that the effective wavelengths of noises radiated from the switching regulator devices 31A, 31B, and 31C and propagating through the insulating resin 42 are about $\lambda_N$, the distances $P_{G1}$ and $P_{G2}$ are preferably set to lengths less than about $\lambda_N/4$, for example.

In the insulating resin 42, conductive members 261G are provided and are serially connected to the conductive via holes 241G. Accordingly, the conductive members 261G are arranged with the distance $P_{G1}$ or distance $P_{G2}$ therebetween. Accordingly, the conductive members 261G turn out to be also arranged preferably with a distance therebetween less than about one quarter of $\lambda_N$ serving as the effective wavelengths of noises radiated from the switching regulator devices 31A, 31B, and 31C (about $\lambda_N/4$), for example. Accordingly, noises generated from switching regulator devices 31A, 31B, and 31C and coming around from the side surface of the laminated body 20E to the back surface 21 thereof are trapped by the conductive members 261G provided in the insulating resin 42. Accordingly, it is possible to effectively reduce and prevent the propagation of noises to the linear regulator devices 32A and 32B. Furthermore, by adopting this configuration, it is also possible to significantly reduce and prevent the propagation of noises from the outside to the linear regulator devices 32A and 32B.

Furthermore, it is more preferable that a distance between the plural conductive via holes 251G provided on the inner circumference side is caused to be less than (about $\lambda_N/4$), for example. Accordingly, a distance between conductive members 271G provided in the insulating resin 42 and connected to the plural conductive via holes 251G turns out to be less than (about $\lambda_N/4$), for example. Accordingly, it is possible to configure a double trap for a noise.

In addition, the outer circumference side may also include the conductive via holes 251G, and the inner circumference side may also include the conductive via holes 241G. In addition, each of the outer circumference side and the inner circumference side may also include the conductive via holes 241G and the conductive via holes 251G. However, since the conductive via holes 241G are connected to the internal ground electrode 222 connecting to the linear regulator devices 32A and 32B, it is preferable that the conductive via holes 241G are located on the inner circumference side as described above.

Figure 7:
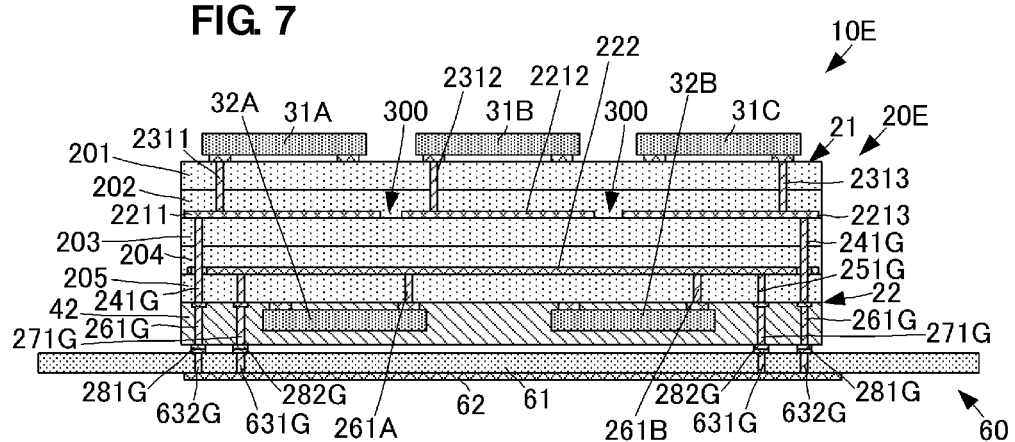
FIG. 7 is a side view illustrating a state where the power source control circuit module according to the sixth preferred embodiment is mounted on a mother substrate.

The power source control circuit module 10E having such a configuration as described above is mounted on a mother substrate 61 including a ground electrode 62, as illustrated in FIG. 7. FIG. 7 is a side view illustrating a state where the power source control circuit module 10E according to the sixth preferred embodiment is mounted on the mother substrate 61.

As illustrated in FIG. 7, external connection terminals 281G and 282G connected to the conductive via holes 241G (conductive members 261G) and the conductive via holes 251G (conductive members 271G) of the power source control circuit module 10E are connected to the ground electrode 62 of the mother substrate 61 through conductive via holes 631G and 632G formed in the mother substrate 61. In a region on the mother substrate 61, in which the power source control circuit module is mounted, the ground electrode 62 that substantially extends across substantially the whole area thereof is preferably arranged as illustrated in FIG. 7.

According to such a configuration, in a state of being mounted in the mother substrate 61, substantially the whole area of the surfaces of the linear regulator devices 32A and 32B in the power source control circuit module 10E, located on a side opposite to the laminated body 20E, is covered by the ground electrode 62 of the mother substrate 61. Accordingly, this ground electrode 62 also significantly reduces and prevents the propagation of noises to the linear regulator devices 32A and 32B.

As described above, by utilizing the configuration of the present preferred embodiment, the internal ground electrode within the laminated body 20E, conductive via hole groups connected thereto, and the ground electrode 62 of the mother substrate 61 three-dimensionally shield the linear regulator devices 32A and 32B from noises generated from the switching regulator devices 31A, 31B, and 31C. Therefore, it is possible to more reliably prevent a power source control characteristic from being lowered.

Figure 8:
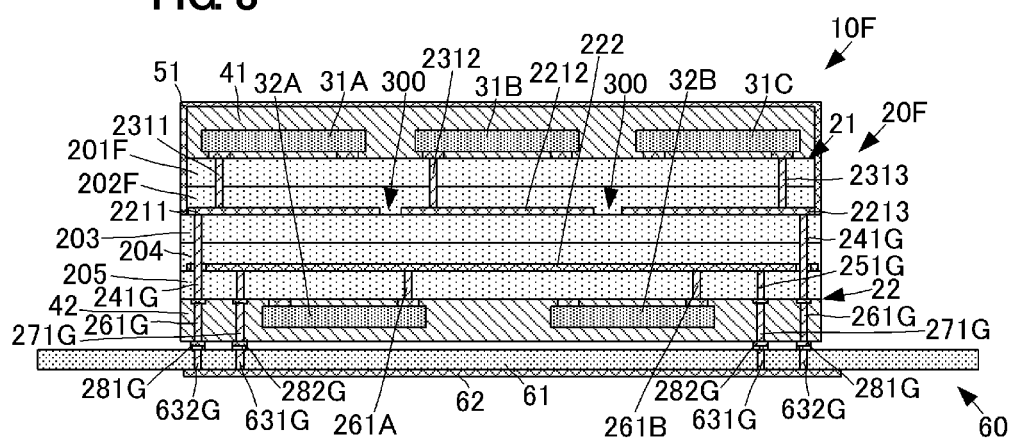
FIG. 8 is a side view illustrating a state where a power source control circuit module according to a seventh preferred embodiment of the present invention is mounted on the mother substrate.

Next, a power source control circuit module according to a seventh preferred embodiment of the present invention will be described with reference to a drawing. FIG. 8 is a side view illustrating a state where a power source control circuit module 10F according to the seventh preferred embodiment is mounted on the mother substrate 61. The power source control circuit module 10F of the present preferred embodiment has the configuration of conductive via holes of the power source control circuit module 10E illustrated in the sixth preferred embodiment, and furthermore, in the same way as the power source control circuit module 10B according to the third preferred embodiment, the shielding member 51 is arranged on the surface 21 of the laminated body 20F.

By adopting such a configuration, it is possible to realize a power source control circuit module with a higher shieldability for a noise.

Figure 9:
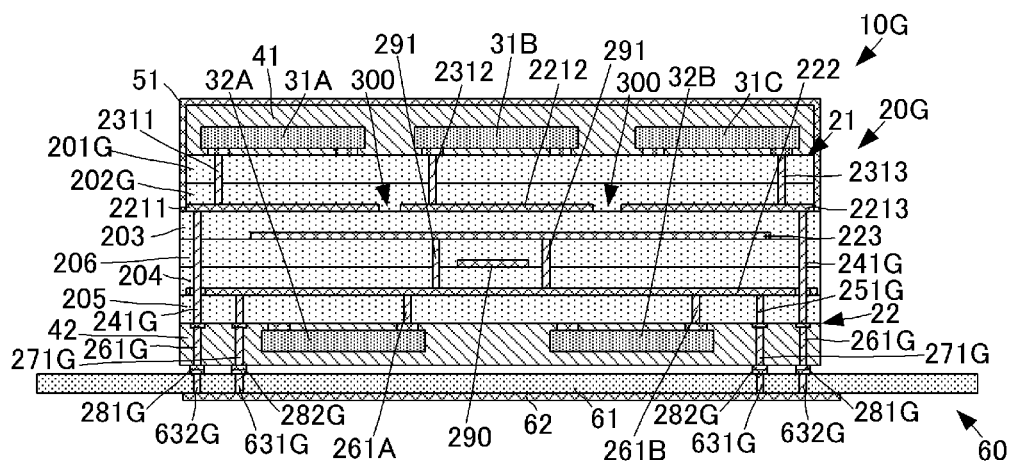
FIG. 9 is a side view illustrating a state where a power source control circuit module according to an eighth preferred embodiment of the present invention is mounted on the mother substrate.
Figure 10A:
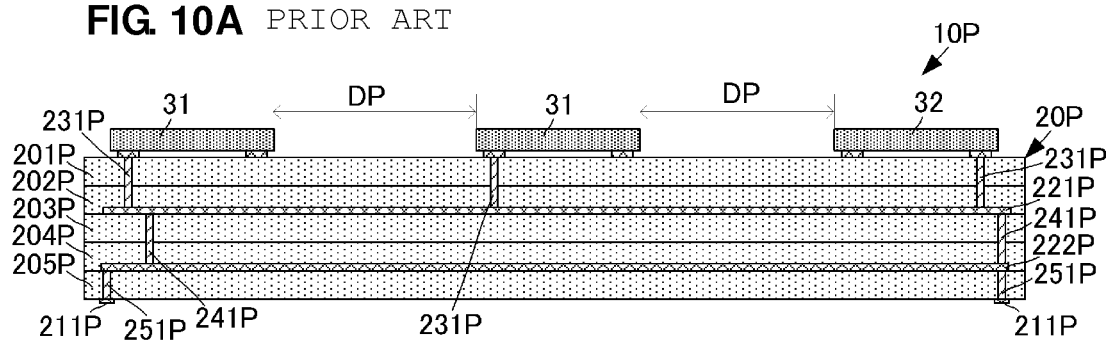
FIG. 10A is a side view illustrating a configuration of a power source control circuit module of the related art.
Figure 10B:
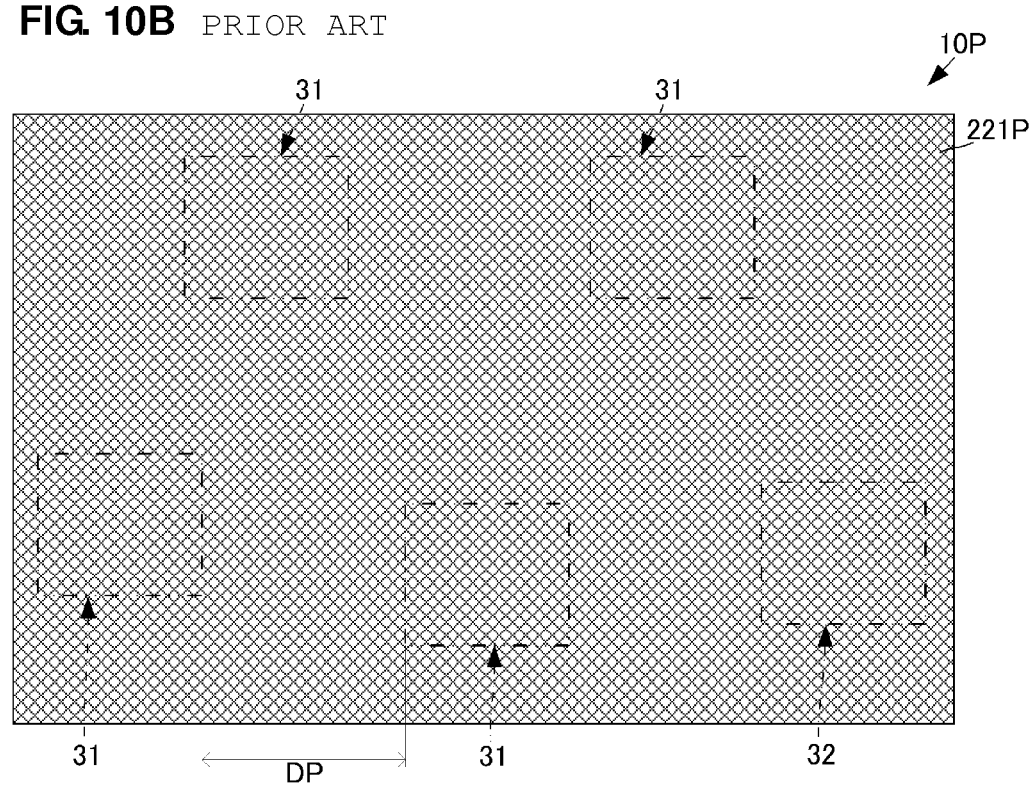
FIG. 10B is a diagram illustrating a rough shape of a pattern of an internal ground electrode.

Next, a power source control circuit module according to an eighth preferred embodiment of the present invention will be described with reference to a drawing. FIG. 9 is a side view illustrating a state where a power source control circuit module 10G according to the eighth preferred embodiment is mounted on the mother substrate 61.

The power source control circuit module 10G of the present preferred embodiment illustrates a case where a dielectric layer 206 defining an intermediate layer is added and an internal pattern electrode through which a digital signal is propagated is further provided, with respect to the power source control circuit module 10F according to the seventh preferred embodiment. Accordingly, only differences will be described.

Between the dielectric layers 203 and 204 illustrated in each preferred embodiment described above, the dielectric layer 206 is preferably provided.

In an interface between the dielectric layers 203 and 206, an internal ground electrode 223 is provided. In an interface between the dielectric layers 206 and 204, a substantially linear electrode pattern 290 for a digital signal is provided.

In the dielectric layers 206 and 204, a plurality of conductive via holes 291 are formed with a given distance therebetween so as to surround the forming region of the substantially linear electrode pattern 290. The plural conductive via holes 291 are connected to the internal ground electrodes 222 and 223. These plural conductive via holes 291 are arranged in an array preferably with a distance therebetween less than the about $\lambda_N/4$, for example.

By adopting such a configuration, the internal ground electrodes 222 and 223 and the plural conductive via holes 291 three-dimensionally shield the substantially linear electrode pattern 290 from noises generated from the switching regulator devices 31A, 31B, and 31C. Therefore, it is possible to prevent a noise from being superimposed on the digital signal, and it is possible to more reliably prevent a power source control characteristic from being lowered.

In addition, in each preferred embodiment described above, when the shielding member 51 is used, a plurality of conductive via holes may preferably be provided in the insulating resin 41 in place of the corresponding shielding member 51, and a substantially flat film-shaped electrode pattern may also be arranged along substantially the whole area of the surface of the insulating resin 41. In this case, it is only necessary for the plural conductive via holes to be formed along the outer circumference of the insulating resin 41, and an arrangement distance therebetween is preferably about $\lambda_N/4$, for example. The plural conductive via holes are connected to the substantially flat film-shaped electrode pattern provided in the surface of the insulating resin 41, and connected to internal ground electrodes connected to the switching regulator devices.

In addition, the preferred embodiments utilizing the digital ICs in the above-mentioned preferred embodiments may also be applied to a preferred embodiment where an audio IC, an element group configuring an RF circuit, an element group configuring a sensor peripheral circuit, an oscillator such as crystal, or an electronic component such as a processor susceptible to an external noise is used in place of the digital IC.

In addition, furthermore, while, in each preferred embodiment described above, a regulator device to be mounted on one surface of a laminated body has been described with a device to be individually mounted as an example, the configurations of the above-mentioned preferred embodiments may also be applied when a composite regulator IC is used where a plurality of regulator devices are installed within one chip.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power source control circuit module comprising:
   a laminated body including a plurality of dielectric layers laminated on each other;
   a plurality of regulator devices mounted on a surface of the laminated body and including a switching regulator device;
   a first internal ground electrode connected to the plurality of regulator devices and arranged along substantially a whole surface of one of the plurality of dielectric layers within the laminated body;
   a first external ground connection terminal connected to the first internal ground electrode and provided on a back surface of the laminated body;
   a circuit element mounted on the back surface of the laminated body;
   a second internal ground electrode arranged along substantially a whole surface of one of the plurality of dielectric layers that is different from the first internal ground electrode; and
   a second external ground connection terminal connected to the second internal ground electrode and provided on the back surface of the laminated body; wherein
   the first internal ground electrode is electrically divided with respect to each of the plurality of regulator devices;
   individual electrodes of the divided first internal ground electrode are connected to the respective first external ground connection terminals; and
   the circuit element is connected to the second internal ground electrode.

2. The power source control circuit module according to claim 1, wherein the plurality of regulator devices mounted on the surface of the laminated body are switching regulator devices.

3. The power source control circuit module according to claim 1, further comprising:
   a plurality of first conductive via holes having shapes substantially extending in a lamination direction of the laminated body and arranged to provide a connection between the first internal ground electrode and the first external ground connection terminal;
   a back surface side insulating resin provided on the back surface of the laminated body and arranged to cover the circuit element; and
   a plurality of second conductive via holes provided in the back surface side insulating resin so as to be serially connected to the plurality of first conductive via holes; wherein
   the plurality of first and second conductive via holes surround a mounting area of the circuit element.

4. The power source control circuit module according to claim 3, wherein the first and second conductive via holes are spaced from each other by a distance that is less than about one quarter of an effective wavelength $\lambda_N$ in the back surface side insulating resin of a noise radiated from the switching regulator device.

5. The power source control circuit module according to claim 1, wherein a substantially linear electrode pattern through which a signal susceptible to an external noise is transmitted is provided on one of the plurality of dielectric layers of the laminated body;
   the substantially linear electrode pattern is surrounded by the second ground electrode, a plurality of conductive via holes connected to the second ground electrode, and a substantially planar electrode provided on a side opposite to the second ground electrode with reference to the substantially linear electrode pattern connected by the conductive via holes.

6. The power source control circuit module according to claim 1, further comprising a shielding member that is provided on the surface of the laminated body and has a shape substantially containing the plurality of regulator devices so as to block an electromagnetic wave.

* * * * *